(12) United States Patent
Nishiwaki

(10) Patent No.: US 7,276,840 B2
(45) Date of Patent: Oct. 2, 2007

(54) STRUCTURE WITH A PLURALITY OF SUBSTRATES, ITS MANUFACTURING METHOD AND CRYSTAL OSCILLATOR WITH THE STRUCTURE

(75) Inventor: Masakazu Nishiwaki, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 11/147,661

(22) Filed: Jun. 8, 2005

(65) Prior Publication Data

US 2005/0275317 A1   Dec. 15, 2005

(30) Foreign Application Priority Data

Jun. 9, 2004    (JP)   ............... 2004-170745
May 25, 2005   (JP)   ............... 2005-153155

(51) Int. Cl.
   *H01L 41/053*   (2006.01)
(52) U.S. Cl. ............... 310/348; 174/260; 174/261; 257/686
(58) Field of Classification Search ............... 310/348; 361/804, 758; 174/260, 261, 528, 530, 541; 257/686

See application file for complete search history.

(56) References Cited

U.S. PATENT DOCUMENTS 5,173,841 A * 12/1992 Uenaka et al. ............... 361/758
6,609,915 B2 * 8/2003 Adams et al. ................. 439/74
6,667,664 B2 * 12/2003 Akagawa et al. ............. 331/68
6,777,799 B2 * 8/2004 Kikuma et al. ............. 257/686

FOREIGN PATENT DOCUMENTS

JP          3-003506          1/1991

* cited by examiner

*Primary Examiner*—Darren Schuberg
*Assistant Examiner*—Derek Rosenau
(74) *Attorney, Agent, or Firm*—Greer, Burns & Crain, Ltd.

(57) ABSTRACT

The structure provided with a plurality of substrates of the present invention is provided with a plurality of substrates each provided with chip-shaped circuit devices connected by poles also used as electrical wiring. At least one pole connecting the plurality of substrates is also used as one of the circuit devices. Simultaneously, the circuit devices also used as poles are mounted on each substrate in a standing posture.

5 Claims, 13 Drawing Sheets

PRIOR ART
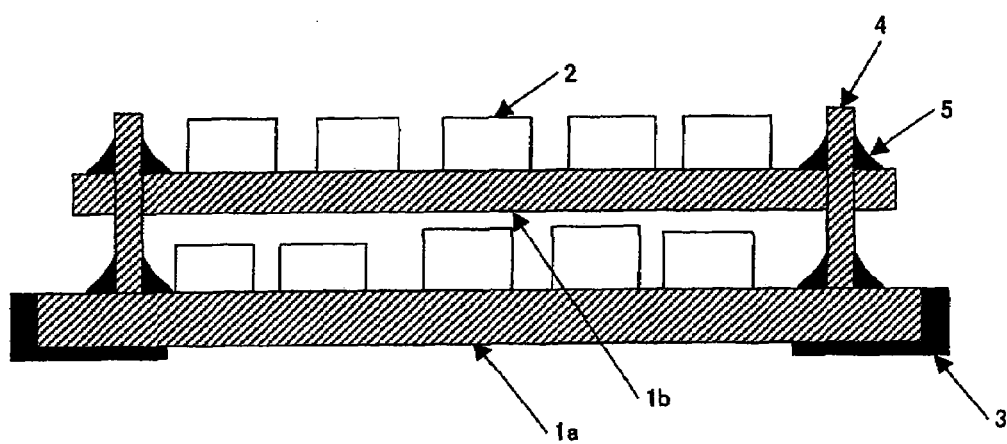
F I G. 1

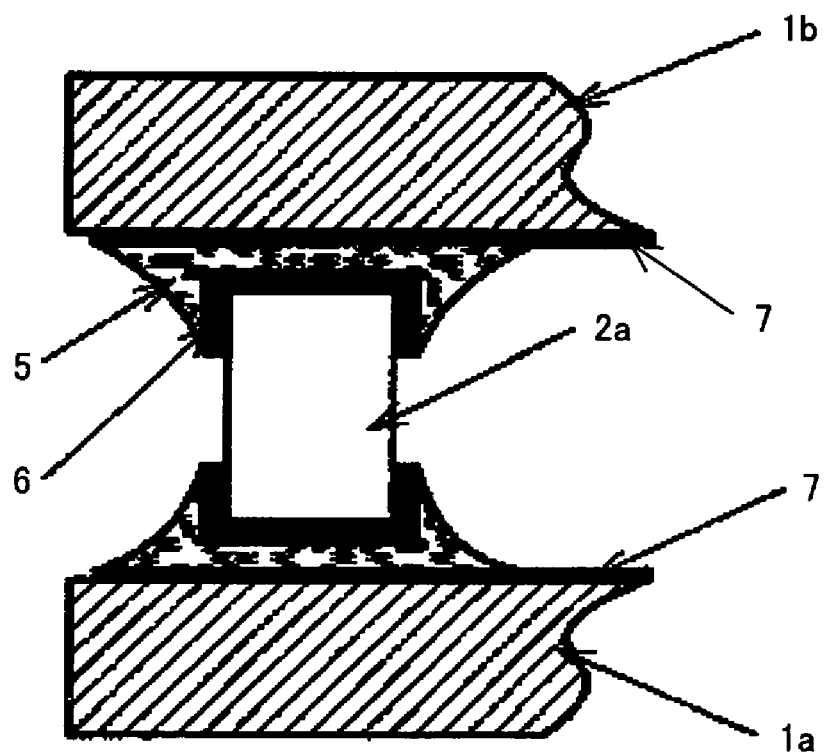
F I G. 6 A

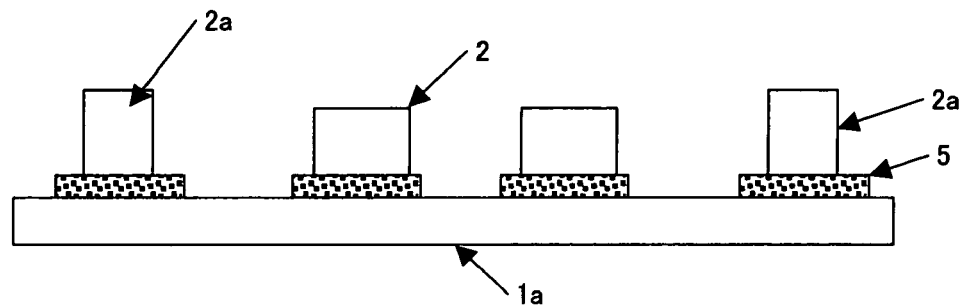
F I G. 7 A
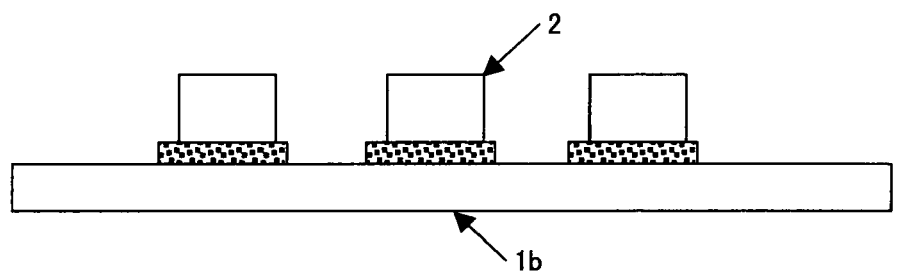
F I G. 7 B
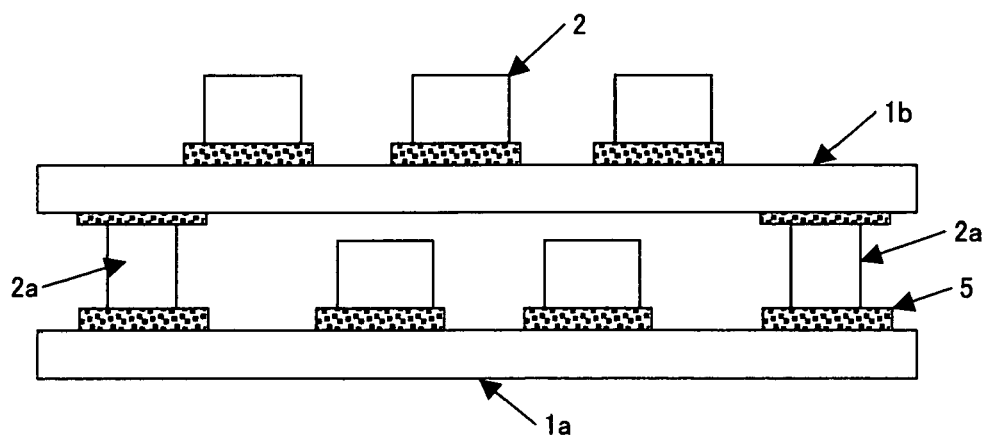
F I G. 7 C

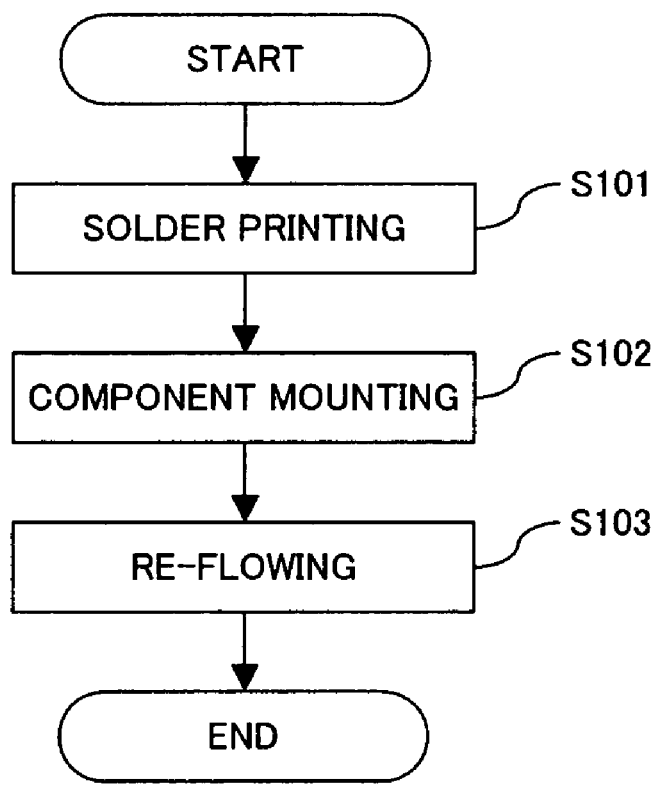
F I G. 8

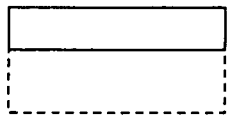
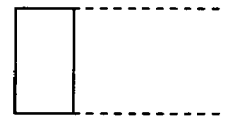

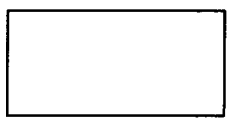
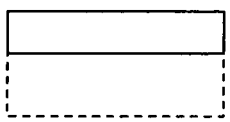

CONVENTIONAL CIRCUIT DEVICES MOUNTED ON THE SUBSTRATE IN A LYING POSTURE

CIRCUIT DEVICES MOUNTED ON THE SUBSTRATE IN A STANDING POSTURE IN SUCH A WAY THAT THE DIRECTION CONNECTING THE RESPECTIVE ELECTRODES AT EACH END OF THE CIRCUIT DEVICE IS PERPENDICULAR TO THE DIRECTION NORMAL TO THE SUBSTRATE

CIRCUIT DEVICES MOUNTED ON THE SUBSTRATE IN A STANDING POSTURE IN SUCH A WAY THAT THE DIRECTION CONNECTING THE RESPECTIVE ELECTRODES AT EACH ENDOF THE CIRCUIT DEVICE IS IN PARALLEL TO THE DIRECTION NORMAL TO THE SUBSTRATE

FIG. 11

STRUCTURE WITH A PLURALITY OF SUBSTRATES, ITS MANUFACTURING METHOD AND CRYSTAL OSCILLATOR WITH THE STRUCTURE

BACKGROUND OF THE INVENTION

1. Field of the Invention

The present invention relates to a structure provided with a plurality of substrates, a manufacturing method thereof and a crystal oscillator using the structure, and more particularly, it relates to a structure provided with a plurality of substrates capable of effectively utilizing its surface area, a manufacturing method thereof and a crystal oscillator using the structure.

2. Description of the Related Art

There is sometimes a case where a circuit for performing necessary operations must be provided within a predetermined area for design reasons. If the area needed when all devices constituting such a circuit on one substrate exceeds the predetermined area, usually the substrate is divided into a plurality of substrates so that all the devices can be accommodated in the divided substrates within the predetermined area.

For example, a structure provided with a plurality of substrates is installed in an apparatus for the above-mentioned purpose. The explanation below is given by using a crystal oscillator as one example of an apparatus including a structure provided with a plurality of substrates.

A crystal oscillator is built into radio equipment, for example, as the reference source of a communication frequency. With the recent use of higher frequencies as communication frequencies, sometimes the number of components increases due to the use of multiplier circuits and the like, and there miniaturization is required.

FIG. 1 is the basic section view of a conventional crystal oscillator disclosed by the following Patent reference 1 and the like. The crystal oscillator comprises a first substrate 1a and a second substrate 1b, which are vertically disposed. On the first substrate 1a and second substrate 1b, circuit devices 2, such as a crystal oscillator, an IC, a capacitor, a resistor and the like, are installed.

The first substrate 1a has a surface-mounted external terminal 3 at each of its four corners of its base surface (back surface). A metal pin 4 is connected to the surface of each of the four corners by solder 5 as a pole and is installed on the first substrate 1a. The second substrate 1b is connected to the first substrate 1a through the metal pin 4 by solder 5 and is held above the first substrate 1a. The metal pin 4 electrically connects the respective circuit patterns of the first and second substrates 1a and 1b. Then, a metal cover, which is not shown in FIG. 1, is jointed to the first substrate 1a to cover the second substrate 1b.

Patent reference 1: Japanese Patent Application No. H3-3506 "Temperature-compensated Oscillator"

SUMMARY OF THE INVENTION

It is an object of the Present invention to provide a structure provided with a plurality of substrates, capable of facilitating its miniaturization with low cost by effectively utilizing the surface area of each substrate and a manufacturing method thereof.

It is another object of the present invention to provide a surface-mounted oscillator adopting a structure provided with a plurality of substrates, capable of promoting its miniaturization with low cost by effectively utilizing the surface area of each substrate.

The structure provided with a plurality of substrates in the first aspect of the present invention is provided with a plurality of substrates each provided with chip-shaped circuit devices which are connected by poles also used as electrical wiring. At least one of the poles connecting the plurality of substrates is also used as one of the circuit devices. Simultaneously, the circuit device also used as a pole is mounted on each substrate in a standing posture.

Since the circuit device mounted on the substrate in a lying posture conventionally is mounted on the substrate in a standing posture, its required space on the substrate can be reduced by the difference between the area occupied by the circuit device when it is mounted on the substrate in a lying posture and the area occupied by the circuit device when it is mounted on the substrate in a standing posture, thereby realizing the miniaturization of a structure provided with a plurality of substrates with low cost.

In the crystal oscillator in the second aspect of the present invention, the first and second substrates each provided with chip-shaped circuit devices constituting an oscillation circuit are connected by a pole which is also used as electrical wiring, and are vertically disposed. At least one of the poles is also used as one of the circuit devices.

The manufacturing method of a structure provided with a plurality of substrates in the third aspect of the present invention manufactures a structure provided with a plurality of substrates each provided with chip-shaped circuit devices which are connected by poles also used as electrical wiring. The manufacturing method comprises the steps of coating solder on a pattern formed on each substrate, mounting circuit devices on the substrate coated with solder and melting the solder of the circuit device. When manufacturing at least one of the poles connecting the plurality of substrates also used as one of the circuit devices, the manufacturing method further comprises as a part of each of the steps the steps of mounting circuit devices also used as poles on the front or beneath the back surface in a standing posture, fixing the circuit devices also used as its poles on the substrate by melting the solder, coating solder on a position corresponding to the electrode(s) of the circuit devices, on the front or beneath the back surface of the substrate and also fixing the circuit devices also used as its poles on or beneath the joined substrate by melting the solder in a combined state of the coated solder and electrode(s) of the circuit devices.

BRIEF DESCRIPTION OF THE DRAWINGS

FIG. 1 is a cross section view of a conventional surface-mounted oscillator.

FIG. 6A is a cross section view of the pole joined beneath a substrate in the state shown in FIG. 4.

FIG. 7A shows a summary of the manufacturing process of the surface-mounted oscillator shown in FIG. 2 (No1).

FIG. 7B shows a summary of the manufacturing process of the surface-mounted oscillator shown in FIG. 2 (No2).

FIG. 7C shows a summary of the manufacturing process of the surface-mounted oscillator shown in FIG. 2 (No3).

FIG. 8 is a flowchart showing the manufacturing process of a structure provided with a plurality of substrates, such as a crystal oscillator or the like.

FIG. 11 shows the effects of this preferred embodiment.

DESCRIPTION OF THE PREFERRED EMBODIMENTS

Figure 2:
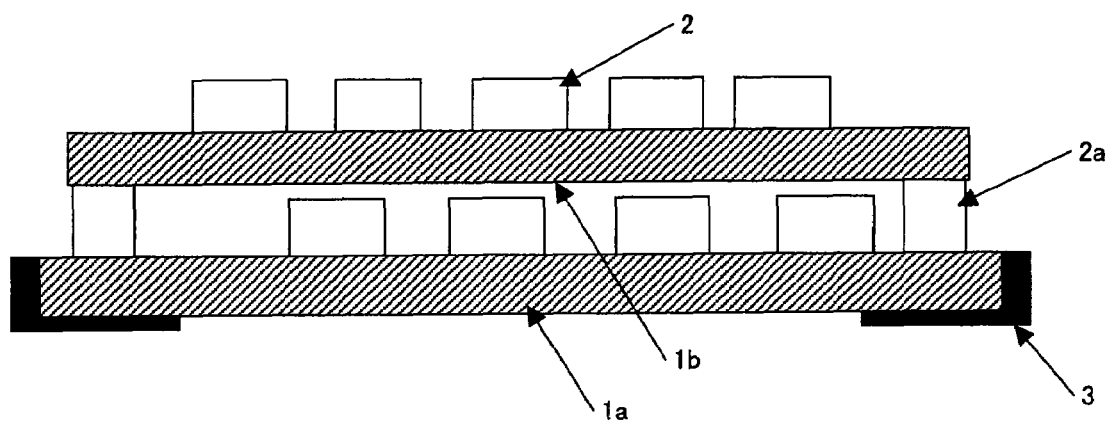
FIG. 2 is a cross section view of the surface-mounted oscillator in one preferred embodiment of the present invention.

FIG. 2 is a cross section view of the surface-mounted oscillator in one preferred embodiment of the present invention. The same reference numerals are attached to the components the same as those of the conventional oscillator, and their descriptions are simplified or omitted here.

Figure 6B:
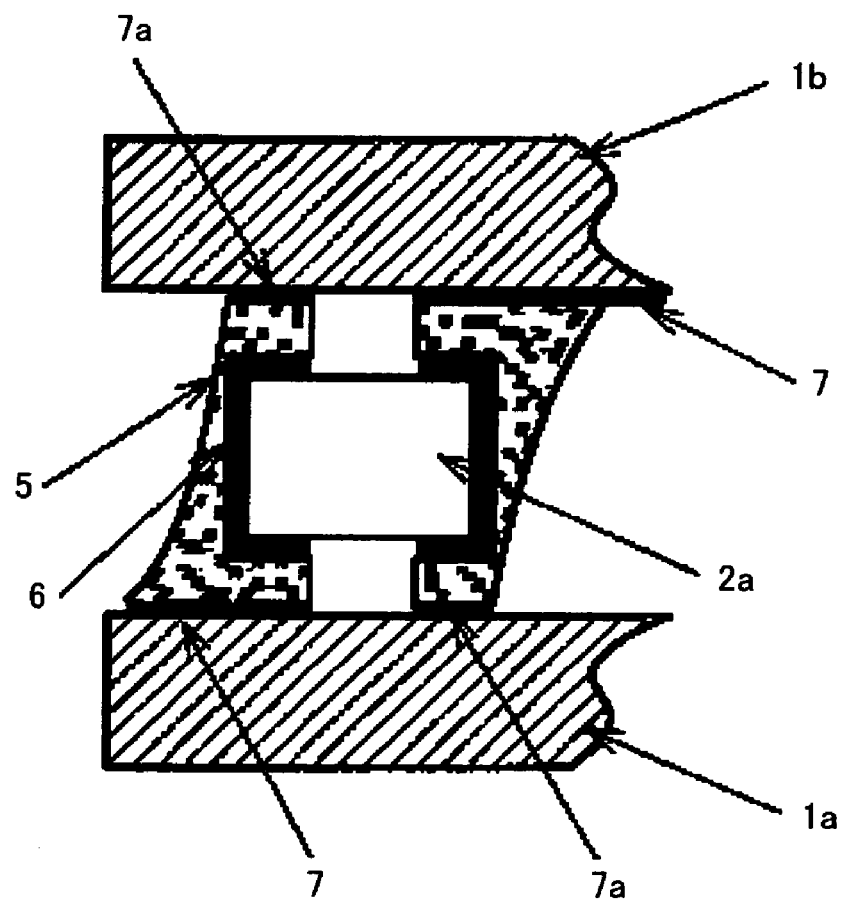
FIG. 6B is a cross section view of the pole joined beneath a substrate in the state shown in FIG. 5.

As described earlier, the surface-mounted oscillator comprises circuit devices 2 constituting an oscillation circuit, the first substrate 1a with a mounting terminal 3 and the second substrate 1b supported by poles at the corners of its boundary. FIGS. 6A and 6B, which are described later, are enlarged cross section views of the pole shown in FIG. 2. In each of FIGS. 6A and 6B, at least one pole, for example, the two front ones of the four poles installed at the corners of its rectangle are also used as circuit devices, such as chip resistors 2a. All the poles can also be used as circuit devices.

Specifically, the first and second substrates 1a and 1b are mechanically connected by connecting each end (terminal 6) of the chip resistor 2a to the respective circuit patterns 7 of the first and second substrates 1a and 1b. Simultaneously the respective circuit patterns 7 of the first and second substrates 1a and 1b are also electrically connected.

If circuit devices, such as the chip resistor 2a and the like, are also used as poles in this way, the area of each substrate can be effectively utilized, for example, without miniaturizing the circuit devices. Accordingly, the effective use of its surface area can be realized at low cost. Since in this preferred embodiment, a circuit device, such as the chip resistor 2a is mounted on the substrate in a standing posture in the direction normal to the substrate, the maximum space between the first and second substrates 1a and 1b can be secured and also the support by poles connecting the substrates can be stabilized. Even if a large size of a structure is anticipated in its initial design, it can be avoided. Simultaneously, the required space on each substrate can be reduced by the difference between an area occupied by the circuit device when it is mounted on the substrate in a lying posture, that is, a rectangular surface of a circuit device (a rectangular parallelepiped) which touches the substrate contains two edges excluding the shortest edge of the rectangular parallelepiped and, an area occupied by the circuit device when it is mounted on the substrate in a standing posture, that is, a rectangular surface of a circuit device (a rectangular parallelepiped) which touches the substrate contains the shortest edge of the rectangular parallelepiped, thereby realizing the miniaturization of a structure provided with a plurality of substrates with low cost.

Figure 3:
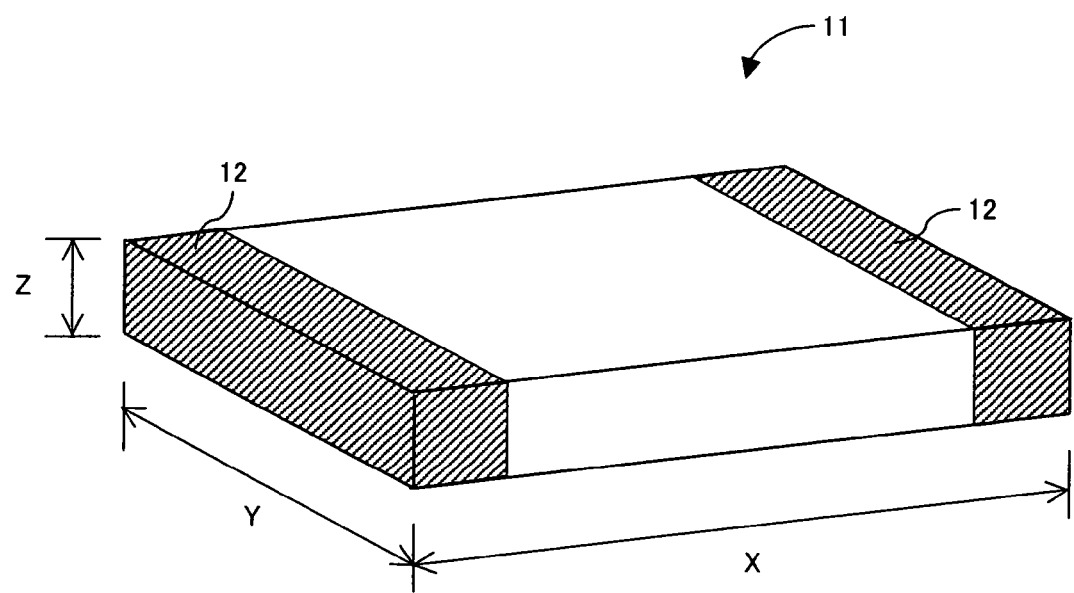
FIG. 3 shows the shape of a circuit device.

As shown in FIG. 3, many circuit devices 11, such as a chip resistor and the like, basically take the shape of a rectangular parallelepiped. More specifically, in this rectangular parallelepiped, the length corresponding to one edge, "Z" is less than the length corresponding to the remaining two edges, "X" and "Y". And the rectangular parallelepiped usually has a terminal (electrode) 12 at each longitudinal end.

Figure 4:
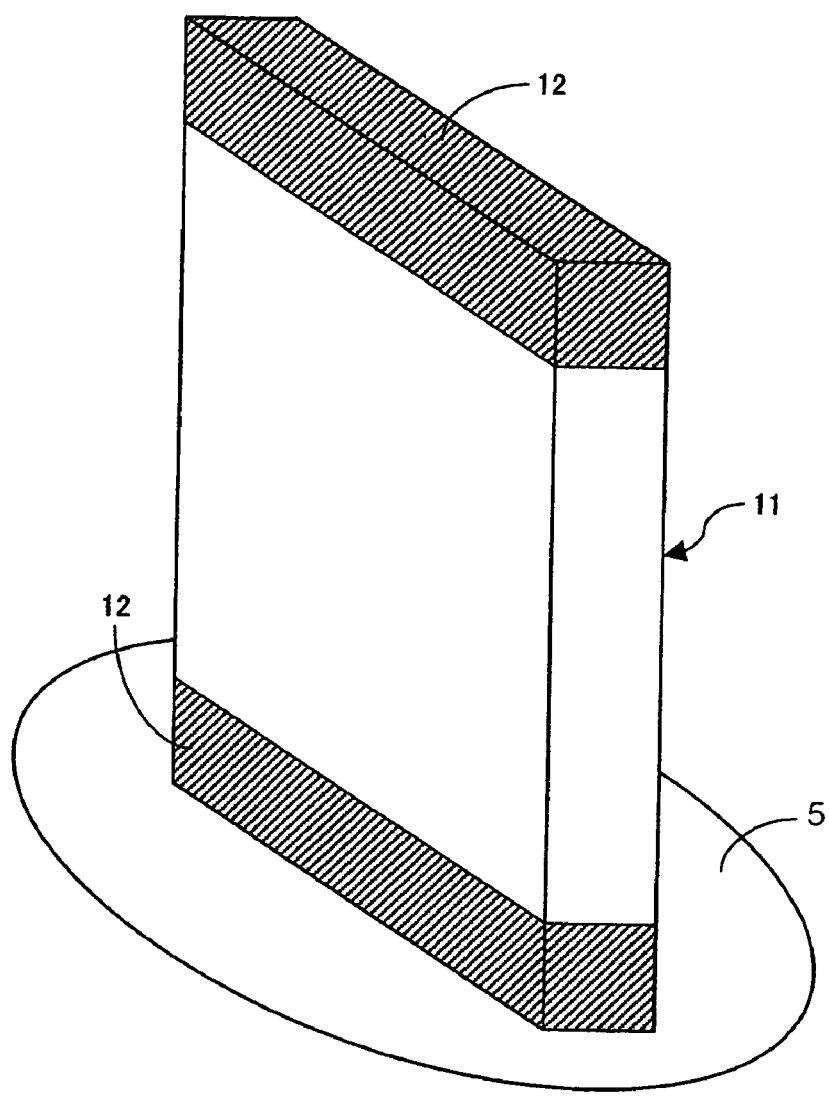
FIG. 4 is a perspective illustration of the circuit device shown in FIG. 3, which is mounted on the substrate in a standing posture in such a way that the direction connecting the electrodes at each end of the circuit device coincides with the direction normal to the substrate.

If in this preferred embodiment, such a circuit device taking the shape of a rectangular parallelepiped is also used as a pole, as shown in FIG. 4, the circuit device 11 is mounted on a substrate using solder 5 in a standing posture in such a way that the direction connecting the respective terminals 12 at each end of the circuit device coincide with the direction normal to a substrate. Alternatively, as shown in FIG. 5, the circuit device 11 can be mounted on the substrate using solder 5 in a standing posture in such a way that the direction connecting the respective terminals 12 at each end of the circuit device is perpendicular to the direction normal to the substrate.

Figure 5:
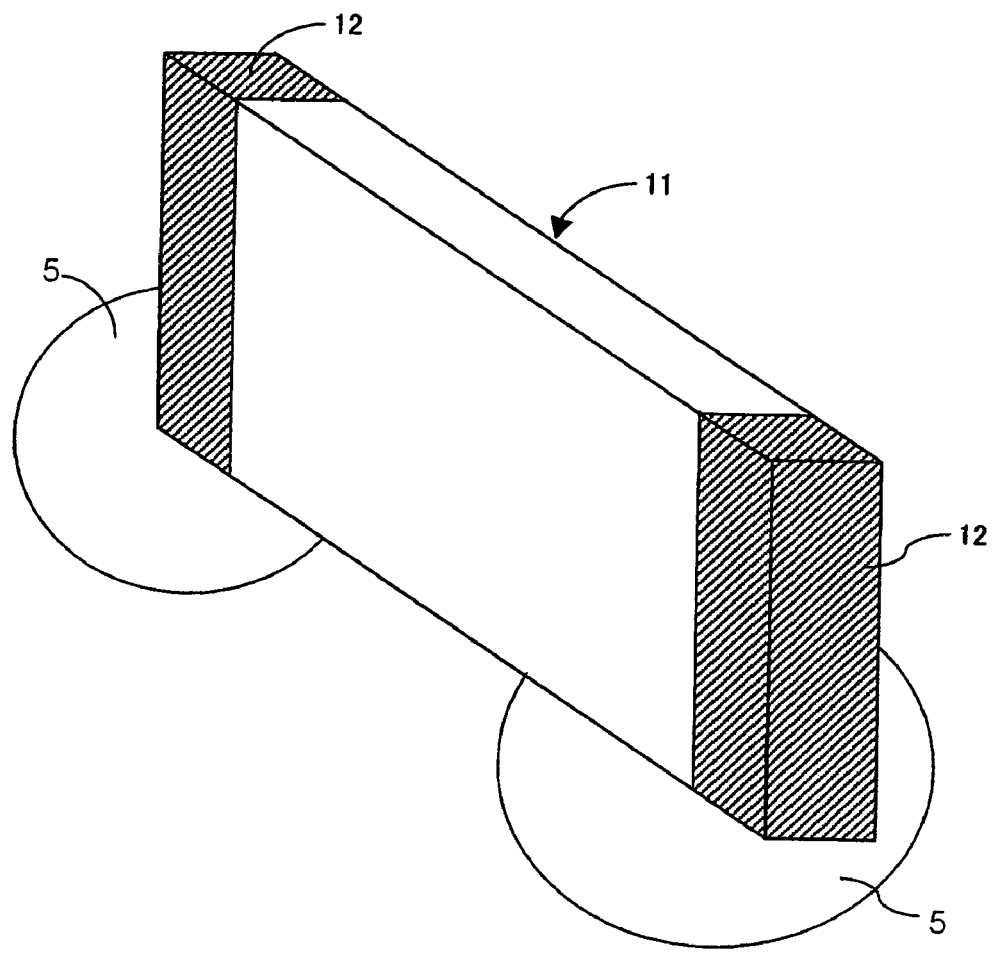
FIG. 5 is a perspective illustration of the circuit device shown in FIG. 3, which is mounted on the substrate in a standing posture in such a way that the direction connecting the electrodes at each end of the circuit device is perpendicular to the direction normal to the substrate.

FIGS. 6A and 6B are cross section views of a pole joined beneath a substrate in the states shown in FIGS. 4 and 5, respectively. If its mass production is not intended, the soldering of poles and the like can also be manually performed.

In FIG. 6A, the direction connecting the electrodes at each end of a circuit device coincides with the direction normal to a substrate. In this case, a circuit device, such as the chip resistor 2a or the like, is electrically connected to the circuit pattern 7 on the front surface of the first substrate 1a or beneath the back surface of the second substrate 1b via the terminal 6 and solder 5.

However, in FIG. 6B, the direction connecting the electrodes at each end of a circuit device is perpendicular to the direction normal to a substrate. In this case, the chip resistor 2a is connected to the circuit pattern 7 and a dummy pattern 7a of the first substrate 1a via the terminal 6 and solder 5 on the one side of each end of the circuit device, and is connected to the circuit pattern 7 and dummy pattern 7a of the second substrate 1b via the terminal 6 and solder 5 on the other side of each end. Since the dummy pattern is provided on the substrate in accordance with a position in which solder is coated, it is isolated and is not included in patterns constituting the circuit pattern. Thus, the chip resistor 2a shown in FIG. 6B is electrically connected to the first or second substrates only via the circuit pattern 7.

FIGS. 7A, 7B, and 7C show the summary of the manufacturing process of the surface-mounted oscillator shown in FIG. 2.

As shown in FIG. 7A, firstly, in order use to a circuit device 2a as a pole, the circuit device 2a mounted on the substrate 1a in a standing posture and a circuit device 2 mounted normal to the substrate 1a in a lying structure are fixed on the substrate 1a by a re-flowing process. As to the substrate 1b, as shown in FIG. 7B, a circuit device 2 mounted normally to the substrate 1b in a lying posture is fixed on the substrate 1b by a re-flowing process. After these processes, as shown in FIG. 7C, a circuit device 2a in a standing posture which is mounted on the substrate 1a and, the back surface of the substrate 1b is fixed by the re-flowing process.

FIG. 8 is a flowchart showing the manufacturing process of a structure provided with a plurality of substrates, such as a crystal oscillator or the like. In this example, it is assumed that a plurality of substrates each provided with chip-shaped circuit devices are connected by poles which are also used as electrical wiring.

As shown in FIG. 8, firstly, in step S101, solder is coated on a pattern generated on the substrate. In step S102, a circuit device is mounted on the coated substrate. In step S103, the coated solder is melted by a re-flowing process. However, during these processes, poles connecting the plurality of substrates which are also used as the above-mentioned circuit devices are simultaneously generated.

Figure 9:
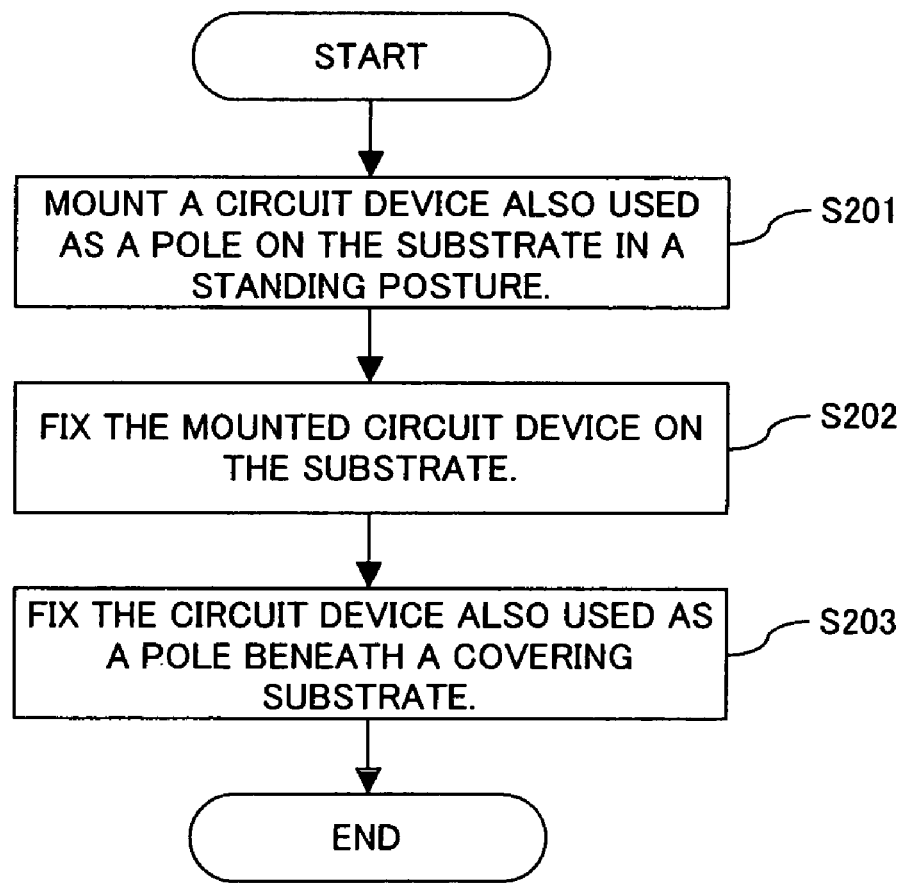
FIG. 9 is a flowchart showing the manufacturing process of a pole which is also used as a circuit device as a part of the flowchart shown in FIG. 8.

Specifically, as shown in FIG. 9, in step S201 as a part of the mounting process, a circuit device is mounted in a standing posture so that either of its terminals touches the substrate or both of its terminals touch the substrate as shown in FIG. 4 or 5. In step S202 as a part of the re-flowing process subsequent to the mounting process, the circuit device is fixed to the substrate by melting solder. In step S203 as a part of the later process of combining the substrates, solder is coated in a position corresponding to an electrode(s) of the circuit device beneath the back surface of a covering substrate, and the solder is melted in the combined state of the coated solder and electrode(s) of the circuit device.

In FIG. 9, a circuit device which is also used as a pole is mounted on the lower substrate in a standing posture. And the circuit device which is also used as a pole is joined to the upper substrate. However, it is also possible to mount a circuit device which is also used as a pole on the upper side substrate from beneath, and then, join the circuit device which is also used as a pole to the lower substrate.

Figure 10:
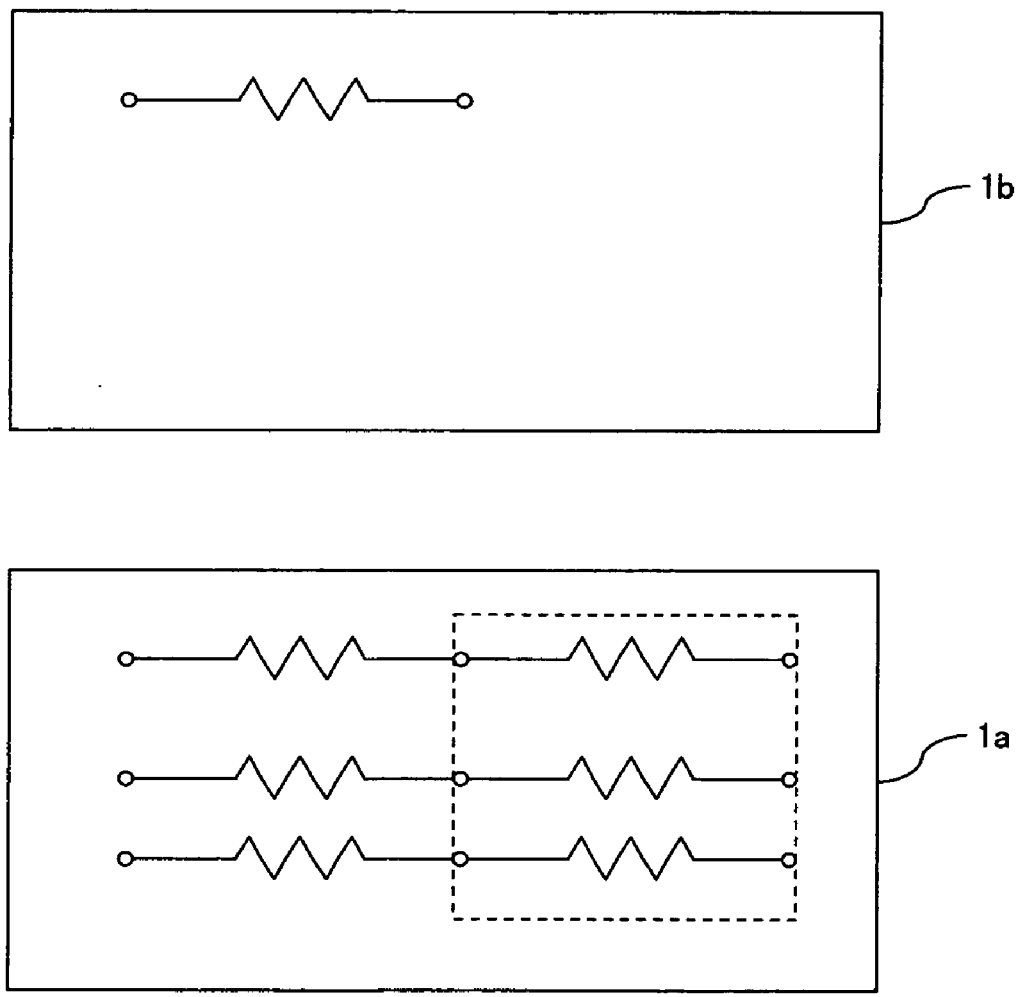
FIG. 10 shows an example of the design plan of the substrate shown in FIG. 2.

FIG. 10 shows an example of a design plan of the substrate 1a or 1b shown in FIG. 2.

In FIG. 10, resistors on the substrate 1b enclosed by a broken line are designed to also be used as poles beforehand. In this case, as shown in FIG. 11, their required space on the substrate can be reduced by the difference (shown by broken lines in the second or third row of FIG. 11) between an area occupied by the circuit device when it is mounted on the substrate in a lying posture and an area occupied by the circuit device when it is mounted on the substrate in a standing posture, that is, in such a way that the direction connecting the respective electrodes at each end of the circuit device coincides with the direction normal to the substrate or in such a way that the direction connecting the respective electrodes at each end of the circuit device is perpendicular to the direction normal to the substrate, thereby realizing the miniaturization of a structure provided with a plurality of substrates with low cost.

The circuit device 2 to be used as a pole can be a chip capacitor or another circuit device constituting an oscillator circuit instead of the chip resistor 2a. For example, if the oscillator circuit is of a constant temperature oven type, the circuit device to be used as a pole can be a thermal control device.

In the above description, a pole is also used as a circuit device. However, since usually a plurality of circuit devices with the same dimensions are used as a plurality of circuit devices to be mounted on a substrate, the height of each pole connecting substrates can be kept constant by using a plurality of circuit devices with the same dimensions as circuit devices which are also used as poles even if a plurality of circuit devices are used as a plurality of poles.

Figure 12:
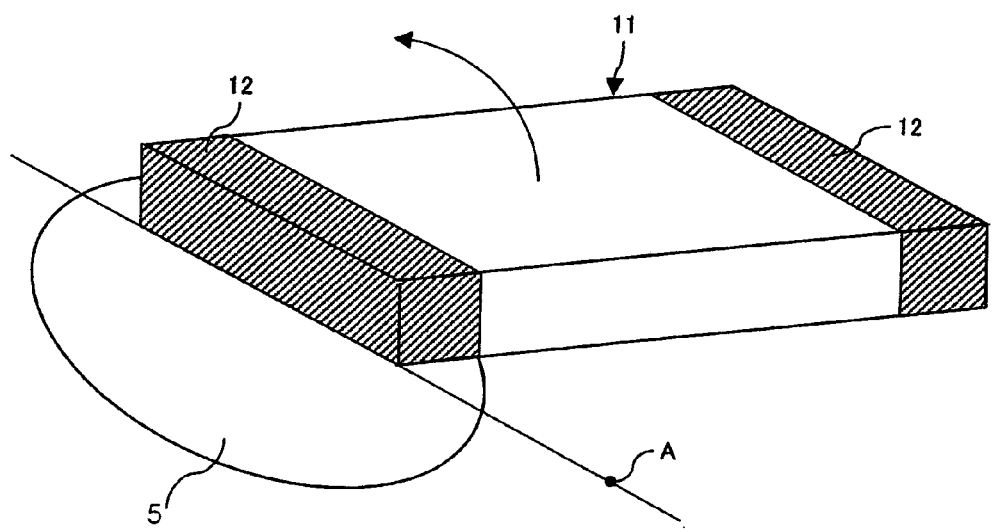
FIG. 12 shows an example of the case where a circuit device which is also used as a pole is mounted in a standing posture.

If a circuit device which is also used as a pole is mounted in a standing posture in such a way that the direction of the respective terminals at each end of the circuit device can be in parallel with the direction normal to each substrate, its mounting process can also be as follows. Specifically, either of the terminals (electrodes) of a circuit device 11 which is also used as a pole can also be mounted on a pattern coated with solder 5 as shown in FIG. 12, and in the re-flowing process subsequent to the mounting process, the circuit device 11 which is also used as a pole can also be mounted in a standing posture by rotating it around the axis A using the tombstone phenomenon by melting the solder 5.

Although in a part of the above description, a crystal oscillator (a surface-mounted oscillator) is used, the present invention is also applicable to a structure provided with a plurality of substrates constituting a circuit other than a crystal oscillator.

What is claimed is:

1. A structure provided with a plurality of circuit boards each provided with chip-shaped circuit devices, which are connected by poles, wherein at least one pole connecting the plurality of circuit boards is also used as one of the circuit devices, the circuit device also used as a pole is mounted on each circuit board in a standing posture, the circuit device has a plurality of electrodes on each longitudinal end, and one of the plurality of electrodes connects to one of the plurality of circuit boards, and another one of the plurality of electrodes connects to another one of the plurality of circuit boards, wherein the circuit device also used as a pole is mounted in a standing posture in such a way that a direction connecting its terminals at each end is in parallel with the direction normal to each circuit board, and wherein the circuit device also used as a pole is mounted on at least one of the ends of at least one of the circuit boards.

2. A crystal oscillator in which first and second circuit boards each provided with chip-shaped circuit devices, are connected by poles and are vertically disposed, wherein at least one of the poles is also used as one of the circuit devices, the circuit device has a plurality of electrodes on each longitudinal end, and one of the plurality of electrodes connects to the first circuit board, and another one of the plurality of electrodes connects to the second circuit board, and wherein the circuit device also used as a pole is mounted in a standing posture in such a way that a direction connecting its terminals at each end is in parallel with the direction normal to each circuit board, and wherein the circuit board also used as a pole is mounted on at least one of the ends of at least one of the circuit boards.

3. The crystal oscillator according to claim 2, wherein the circuit device is orthogonal to the respective surfaces of the first and second circuit boards.

4. A manufacturing method of a structure provided with a plurality of circuit boards each provided with chip-shaped circuit devices, which are connected by poles, and the circuit device has a plurality of electrodes on each longitudinal end, comprising:

coating solder on a pattern formed on each circuit board;

mounting circuit devices on each circuit board coated with solder, and melting the coated solder, and when manufacturing at least one of the poles connecting the plurality of circuit boards also used as one of the circuit devices, the manufacturing method further comprising as a part of each of the steps:

mounting circuit devices also used as poles on the front or beneath the back surface in a standing posture;

fixing the circuit device also used as a pole on the circuit board by melting the solder, coating solder on a position corresponding to the electrode(s) of the circuit device, on the front or beneath the back surface of a joined circuit board; and fixing the circuit device also used as a poles on or beneath the joined circuit board by melting the solder in a combined state of the coated solder and the electrode(s) of the circuit device, and wherein:

one of the plurality of electrodes connects to one of the plurality of circuit boards, and another one of the plurality of electrodes connects to another one of the plurality of circuit boards, and wherein the circuit device also used as a pole is mounted on at least one of the ends of at least one of the circuit boards.

5. The manufacturing method of a structure provided with a plurality of circuit boards according to claim 4, wherein the circuit devices also be used as poles are mounted on each circuit board in such a way that one of the terminals of the circuit device or both terminals of the circuit device touch(es) the coated solder.

* * * * *